United States Patent
Nam et al.

(10) Patent No.: US 9,537,074 B2
(45) Date of Patent: Jan. 3, 2017

(54) HIGH HEAT-RADIANT OPTICAL DEVICE SUBSTRATE

(71) Applicant: Point Engineering Co., Ltd., Asan-si, Chungcheongnam-do (KR)

(72) Inventors: Ki Myung Nam, Cheonan-si (KR); Tae Hwan Song, Cheonan-si (KR); Young Chul Jun, Ansan-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 178 days.

(21) Appl. No.: 14/609,112

(22) Filed: Jan. 29, 2015

(65) Prior Publication Data

US 2015/0147580 A1     May 28, 2015

Related U.S. Application Data

(63) Continuation of application No. 14/129,731, filed as application No. PCT/KR2011/008943 on Nov. 23, 2011, now Pat. No. 9,306,142.

(30) Foreign Application Priority Data

Jun. 27, 2011 (KR) ........................ 10-2011-0062498

(51) Int. Cl.
*B29C 65/00*     (2006.01)
*B32B 3/00*     (2006.01)
(Continued)

(52) U.S. Cl.
CPC .............. *H01L 33/641* (2013.01); *H01L 24/97* (2013.01); *H01L 33/483* (2013.01);
(Continued)

(58) Field of Classification Search
CPC ........ H01L 33/00; H01L 33/005; H01L 33/48; H01L 33/483; H01L 25/0753; H01L 25/50; H05K 2203/0315; H05K 2201/10106; H05K 1/05; B32B 15/08; B32B 15/092; B32B 15/20; B32B 2255/06; B32B 2255/26; B32B 27/04; B32B 2260/046; Y10T 428/31522; B29C 65/48; B29C 65/4835; B29C 66/026; B29C 66/02; B29C 66/72321
(Continued)

(56) References Cited

FOREIGN PATENT DOCUMENTS

| | | | |
|---|---|---|---|
| DE | 2065346 A1 | 5/1973 | ............. B32B 15/08 |
| JP | 09-055535 | 2/1997 | ............. H01L 33/00 |

(Continued)

OTHER PUBLICATIONS

International Searching Authority, International Search Report—International Application No. PCT/KR2011/008943 (WO 2013/002460 A2), dated May 17, 2012, 2 pages.

*Primary Examiner* — Philip Tucker
*Assistant Examiner* — Brian R Slawski
(74) *Attorney, Agent, or Firm* — Sunstein Kann Murphy & Timbers LLP

(57) ABSTRACT

An optical device substrate includes metal plates and insulating layers formed between the metal plates. Each insulating layer includes a cured insulating layer formed by curing insulating material and an anodized layer merged with each metal plate, the anodized layer formed by anodizing a first metal and a second metal of each metal plate. The first metal and the second metal include a first anodized layer and a second anodized layer, respectively, and are electrically insulated by interfaces including a first interface formed between the first metal and the first anodized layer, a second interface formed between the first anodized layer and the cured insulating layer, a third interface formed between the cured insulating layer and the second metal and a fourth interface formed between the second anodized layer and the second metal.

1 Claim, 8 Drawing Sheets

(51) Int. Cl.
- B32B 5/00 (2006.01)
- B32B 5/18 (2006.01)
- B32B 37/00 (2006.01)
- H05K 3/46 (2006.01)
- B32B 38/04 (2006.01)
- C09J 5/02 (2006.01)
- B32B 27/00 (2006.01)
- B32B 7/00 (2006.01)
- B32B 9/00 (2006.01)
- B32B 15/04 (2006.01)
- B32B 15/08 (2006.01)
- B32B 27/38 (2006.01)
- H01L 29/18 (2006.01)
- H01L 33/00 (2010.01)
- H01L 33/64 (2010.01)
- H01L 23/00 (2006.01)
- H01L 33/48 (2010.01)
- H01L 25/00 (2006.01)
- B32B 15/092 (2006.01)
- B32B 15/20 (2006.01)
- B32B 27/04 (2006.01)
- B29C 65/48 (2006.01)
- H01L 33/62 (2010.01)

(52) U.S. Cl.
CPC .......... *H01L 33/644* (2013.01); *H01L 33/647* (2013.01); *B29C 65/4835* (2013.01); *B32B 15/092* (2013.01); *B32B 15/20* (2013.01); *B32B 27/04* (2013.01); *B32B 2255/06* (2013.01); *B32B 2255/26* (2013.01); *B32B 2260/046* (2013.01); *H01L 25/50* (2013.01); *H01L 33/005* (2013.01); *H01L 33/486* (2013.01); *H01L 33/62* (2013.01); *H01L 2224/73265* (2013.01); *H01L 2924/12041* (2013.01); *H01L 2933/0066* (2013.01); *H01L 2933/0075* (2013.01); *Y10T 428/24612* (2015.01); *Y10T 428/31522* (2015.04); *Y10T 428/31678* (2015.04)

(58) Field of Classification Search
USPC ..... 156/60, 77, 150, 151, 250, 272.2, 273.3, 156/273.9, 274.4, 307.1, 307.3, 307.5, 156/307.7, 278, 280; 428/98, 119, 156, 428/172, 411.1, 457, 469, 471, 472.2, 428/413, 414, 416; 257/668, 700, 758, 88
See application file for complete search history.

(56) References Cited

FOREIGN PATENT DOCUMENTS

| | | | |
|---|---|---|---|
| JP | 2001-044317 | 2/2001 | ............. H01L 23/12 |
| JP | 2003-309292 | 10/2003 | ............. H01L 33/00 |
| JP | 2009-105270 | 5/2009 | ............. H01L 23/36 |
| JP | 4925296 | 4/2012 | ............. H01L 23/48 |
| KR | 10-2007-0039006 | 4/2007 | ............. H05K 1/03 |
| KR | 10-2010-0110152 | 10/2010 | ............. H05K 1/02 |
| WO | WO 2006/070457 | 7/2006 | ............. H01L 23/12 |
| WO | WO 2011/122846 A1 | 10/2011 | ............. H01L 33/62 |

HIGH HEAT-RADIANT OPTICAL DEVICE SUBSTRATE

CROSS REFERENCE

This application is a continuation of U.S. application Ser. No. 14/129,731, filed Dec. 27, 2013, now U.S. Pat. No. 9,306,142 which is a §371 application of International Patent Application PCT/KR2011/008943 filed Nov. 23, 2011, which claims priority to Korean Application No. 10-2011-0062498 filed Jun. 27, 2011. All of the foregoing applications are hereby incorporated herein by reference in their entirety.

TECHNICAL FIELD

The present invention relates to an optical device substrate and a method of manufacturing the same, and more particularly, to an optical device substrate, which is superior in interfacial adhesion between a metal layer and an insulating layer and mechanical strength of the insulating layer, and to a method of manufacturing the same.

BACKGROUND ART

Optical devices play a role in converting an electrical signal into light. Typically represented by an optical device, a light emitting diode (LED) has high efficiency and may produce light at high luminance, and the use thereof is thus drastically increasing.

However, because LEDs generate heat in the course of emitting light, they may deteriorate or may negatively affect performance of other parts.

Hence, thorough research is ongoing to manufacture substrates having high mechanical strength while efficiently dissipating heat generated from LEDs, but results thereof are unsatisfactory.

For example, republished Japanese Patent No. WO2006/070457 discloses a highly heat conductive circuit module. As illustrated in (A) to (F) of FIG. 1, metal layers 10 and insulating resin layers 20 are alternately stacked and then cured, and the resulting laminate L is cut, thus obtaining a package 30 in which the metal layers 10 and the insulating resin layers 20 are alternately shown on the cut surface. Then, electronic parts 40 are disposed on the package 30, after which the package 30 is longitudinally and transversely cut and divided into individual package pieces 32, thereby obtaining a plurality of circuit modules M having the metal layers and the insulating layers which are repeated, that is, an optical device substrate.

In such a conventional technique, the laminate including the metal layers 10 and the insulating resin layers 20 which are alternately stacked may be formed by applying a resin paste on the metal layers 10 and then stacking the metal layers, or by alternately stacking the metal layers 10 and the resin films 20, and to obtain adhesion between the metal layers 10 and the insulating resin layers 20, the surfaces of the metal layers 10 may be formed with an oxide film and roughened.

However, in the case where an optical device substrate is manufactured by oxidizing the surfaces of the metal layers 10 and then alternately stacking the metal layers 10 and the resin films 20, pores are present in the oxide layer formed on the metal layer 10 and thus the flat area of the oxide layer in contact with the resin film 20 becomes small, and thereby the metal layer 10 and the insulating resin layer 20 may be undesirably easily separated from each other even by a small force.

Also, in the case where an optical device substrate is manufactured by oxidizing the surfaces of the metal layers 10, coating the metal layers 10 with only a resin paste, namely, a liquid resin binder and then stacking the metal layers, the resin paste may bubble in the course of thermal curing of the resin paste, and thus mechanical strength of the insulating resin layer 20 may become very weak, undesirably easily breaking the optical device substrate.

Also, in the case where an optical device substrate is manufactured by oxidizing the surfaces of the metal layers 10, applying only a liquid resin binder and then stacking the metal layers, when the liquid resin binder is cured, its ductility disappears and is easy to break, and thus the insulating resin layer 20 of the optical device substrate may be undesirably easily broken.

Also, in the case where an optical device substrate is manufactured by oxidizing the surfaces of the metal layers 10, applying only a liquid resin binder and then stacking the metal layers, when the metal layers 10 stacked in a direction of gravity and then pressed using a press are thermally cured, a pressure applied to the lowermost layer and the uppermost layer may vary due to the weight of the metal layers 10, and thus the thickness of the insulating layers of the optical device substrate becomes very non-uniform.

Also, in the case where an optical device substrate is manufactured by oxidizing the surfaces of the metal layers 10, applying only a liquid resin binder and then stacking the metal layers, when the viscosity of the liquid resin binder is high, the liquid resin binder does not infiltrate the oxide films formed on the metal layers 10, whereas when the viscosity thereof is low, the liquid resin binder escapes between the metal layers 10 as soon as the layers are pressed, and undesirably the optical device substrate wherein the insulating layers are only partially provided may be produced.

Also, in the case where an optical device substrate is manufactured by oxidizing the surfaces of the metal layers 10, applying only a liquid resin binder and then stacking the metal layers, the liquid resin may flow down and thus it is very difficult to form the insulating layers at a predetermined thickness or more.

When only the liquid resin binder is used in this way, the thickness of the insulating layers of the optical device substrate is very difficult to uniformly maintain, thus making it considerably difficult to implement packaging of LED chips located at a predetermined interval on the optical device substrate by an automation system.

In addition, Japanese Patent Application Publication No. Hei. 9-55535 simply discloses fabrication of an optical device substrate by alternately stacking conductive members and epoxy adhesive layers and performing cutting in the same direction as the stacking direction, or by applying a liquid epoxy resin on conductive members, stacking metal layers and performing cutting in the same direction as the stacking direction. Thus, this patent also causes substantially the same problems as in republished Japanese Patent No. WO2006/070457 as above.

DISCLOSURE

Technical Problem

Accordingly, the present invention is intended to provide an optical device substrate and a manufacturing method thereof, wherein an optical device substrate 300 is manufactured by anodizing the surfaces of metal plates 100, coating the metal plates 100 with an insulative liquid binder 101 having a viscosity adapted to infiltrate the anodized oxide films of the metal plates 100, alternately stacking the metal plates 100 coated with the liquid binder 101 and insulative binder films 102 before curing the liquid binder 101, and then performing hot pressing, and thereby, a bonding force between the metal plates 100 and the insulating layers 303 may be enhanced, and simultaneously the liquid binder 101 may be prevented from bubbling during thermal curing, thus enhancing mechanical strength of the optical device substrate 300 and decreasing fragility of the liquid binder after curing, and furthermore, the thickness of the insulating layers 303 of the optical device substrate 300 is made uniform, so that the thickness of the insulating layers 303 of the optical device substrate 300 may be precisely controlled.

Also, the present invention is intended to provide an optical device substrate and a manufacturing method thereof, wherein an insulative liquid binder 101 having a viscosity of 0.1~1 Pa·s at room temperature ranging from 5° C. to 40° C. is applied on the oxide films of metal plates 100, and thereby the liquid binder 101 may finely infiltrate the oxide films.

Also, the present invention is intended to provide an optical device substrate and a manufacturing method thereof, wherein an insulative liquid binder 101 having a viscosity of 0.01~0.03 Pa·s in the thermal treatment temperature range of 80~100° C. is applied on the oxide films of metal plates 100, and thereby the liquid binder 101 may finely infiltrate the oxide films.

Also, the present invention is intended to provide an optical device substrate and a manufacturing method thereof, wherein, in the course of a series of anodizing metal plates 100, coating the anodized metal plates 100 with a liquid binder 101, alternately stacking the metal plates 100 coated with the liquid binder 101 and insulative binder films 102 to form a laminate and hot pressing the laminate, a pressure applied to both ends of the laminate is set to 2~10 kg/cm$^2$, and thereby the liquid binder 101 may finely infiltrate the oxide films of the metal plates 100 and excessive mechanical impact may be prevented from being applied to the binder films 102.

Technical Solution

In order to accomplish the above objects, the present invention provides a method of manufacturing an optical device substrate, including anodizing surfaces of a plurality of metal plates; coating the anodized surfaces of the metal plates with an insulative liquid binder having a viscosity adapted to infiltrate anodized oxide films of the metal plates; alternately stacking the metal plates coated with the liquid binder and insulative binder films, before curing the liquid binder; and curing a laminate including the metal plates and the binder films using hot pressing, so that the liquid binder infiltrates the anodized oxide films of the metal plates.

Also, the method according to the present invention may further include, after curing, cutting the laminate including the metal plates and the binder films in a direction same as a stacking direction, thus forming a plurality of optical device substrates.

Also, in the method according to the present invention, the metal plates may include any one selected from among aluminum, an aluminum alloy, magnesium, and a magnesium alloy.

Also, in the method according to the present invention, the liquid binder and the binder films may include a polymer- or epoxy-based thermosetting resin.

Also, in the method according to the present invention, the viscosity of the liquid binder may be 0.1~1 Pa·s at room temperature ranging from 5° C. to 40° C.

Also, in the method according to the present invention, the liquid binder may have a viscosity of 0.01~0.03 Pa·s in a thermal treatment temperature range of 80~100° C. during heating upon curing.

Also, the method according to the present invention may further include processing the cut surface of the optical device substrate formed upon cutting, thus forming a reflector cup having a bottom surface and an inclined surface extending therefrom.

Also, in the method according to the present invention, a pressure applied to both ends of the laminate including the metal plates and the binder films upon curing may be 2~10 kg/cm$^2$.

Also, the method according to the present invention may further include plating the optical device substrate with any one or more selected from among silver (Ag), gold (Au), nickel (Ni), copper (Cu), and palladium (Pd).

Advantageous Effects

According to the present invention, an optical device substrate 300 is manufactured by anodizing the surfaces of metal plates 100, coating the metal plates 100 with an insulative liquid binder 101 having a viscosity adapted to infiltrate the anodized oxide films of the metal plates 100, alternately stacking the metal plates 100 coated with the liquid binder 101 and insulative binder films 102 before curing the liquid binder 101, and performing hot pressing, and thereby, a bonding force between the metal plates 100 and the insulating layers 303 can be enhanced, and simultaneously the liquid binder 101 can be prevented from bubbling during thermal curing, thus enhancing mechanical strength of the optical device substrate 300 and decreasing fragility of the liquid binder after curing, and furthermore, the thickness of the insulating layers 303 of the optical device substrate 300 is made uniform, so that the thickness of the insulating layers 303 of the optical device substrate 300 can be precisely controlled.

Also, according to the present invention, the insulative liquid binder 101 having a viscosity of 0.1~1 Pa·s at room temperature ranging from 5° C. to 40° C. is applied on the oxide films of the metal plates 100, and thereby the liquid binder 101 can finely infiltrate the oxide films.

Also, according to the present invention, the insulative liquid binder 101 having a viscosity of 0.01~0.03 Pa·s in the thermal treatment temperature range of 80~100° C. is applied on the oxide films of the metal plates 100, and thereby the liquid binder 101 can finely infiltrate the oxide films.

Also, according to the present invention, in the course of a series of anodizing the metal plates 100, coating the anodized metal plates 100 with the liquid binder 101, alternately stacking the metal plates 100 coated with the liquid binder 101 and the insulative binder films 102 to form a laminate and hot pressing the laminate, a pressure applied to both ends of the laminate is set to 2~10 kg/cm$^2$, and thereby the liquid binder 101 can finely infiltrate the oxide films of the metal plates 100 and excessive mechanical impact can be prevented from being applied to the binder films 102.

MODE FOR INVENTION

Hereinafter, a detailed description will be given of the present invention with reference to the appended drawings.

Figure 1:
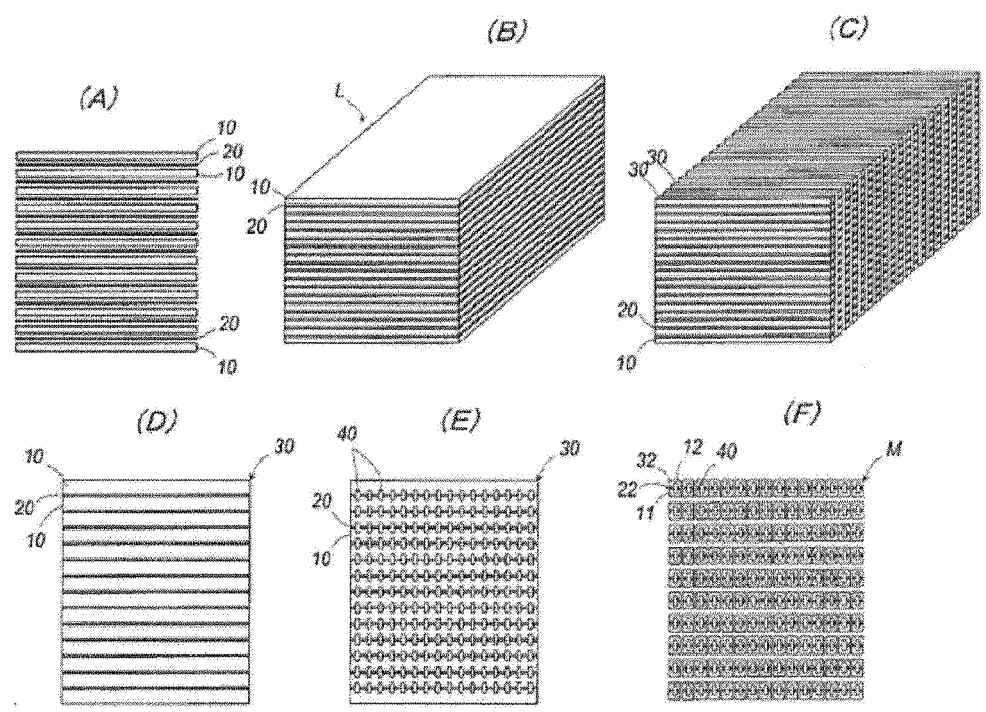
FIG. 1 is of views illustrating individual steps of a process of manufacturing an optical device substrate according to a conventional technique.
Figure 2:
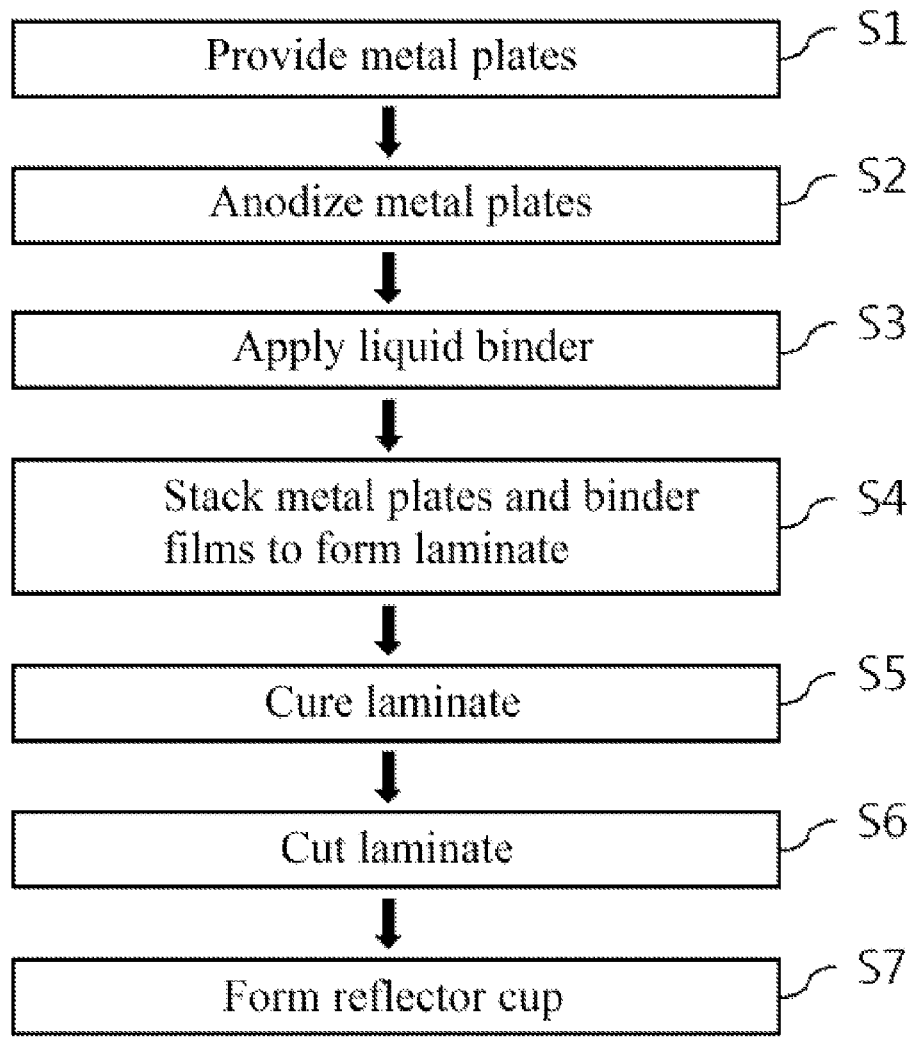
FIG. 2 is a flowchart illustrating a process of manufacturing an optical device substrate according to the present invention.
Figure 3:
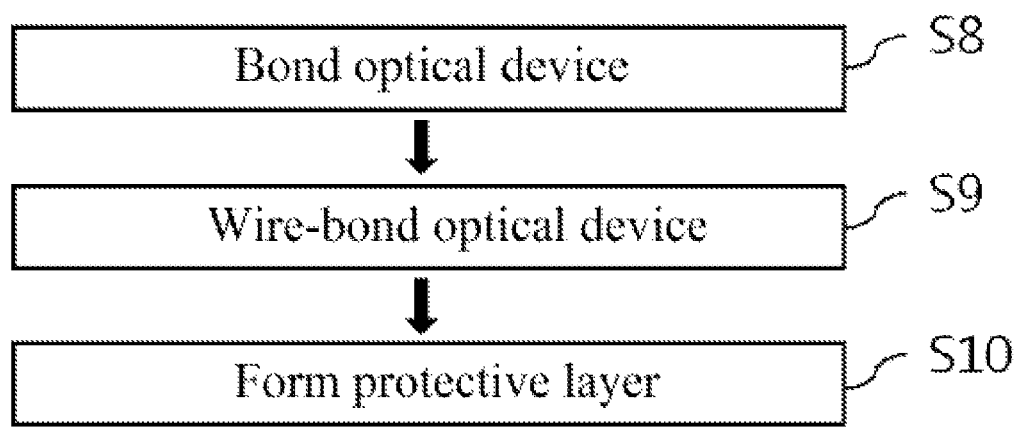
FIG. 3 is a flowchart illustrating individual steps of a process of packaging an optical device on the optical device substrate according to the present invention.

FIG. 2 is a flowchart illustrating a process of manufacturing an optical device substrate according to an embodiment of the present invention, and FIG. 3 is a flowchart illustrating individual steps of a process of packaging an optical device on the optical device substrate according to the present invention.

As illustrated in FIG. 2, the method of manufacturing the optical device substrate according to the present invention includes providing metal plates 100 (S1), anodizing the metal plates 100 (S2), applying a liquid binder 101 on the anodized surfaces of the metal plates 100 (S3), alternately stacking the metal plates 100 coated with the liquid binder 101 and binder films 102 (S4), curing a laminate including the metal plates 100 and the binder films 102 using hot pressing (S5), cutting the laminate including the metal plates 100 and the binder films 102 in the same direction as the stacking direction (S6), and processing the cut surface of the resulting substrate to form a reflector cup having a bottom surface 501 and an inclined surface 502 extending therefrom (S7).

As illustrated in FIG. 3, packaging an optical device 400 on the optical device substrate 300 according to the present invention includes bonding an optical device 400 to the optical device substrate 300 (S8), wire-bonding the optical device 400 to an electrode 100' (S9), and forming a protective layer 407 to enclose the optical device 400 and the conductive wire 405.

Below is a detailed description of the method of manufacturing the optical device substrate 300 as illustrated in FIG. 2 and the packaging of the optical device 400 as illustrated in FIG. 3, with reference to FIGS. 4 to 9.

Figure 4:
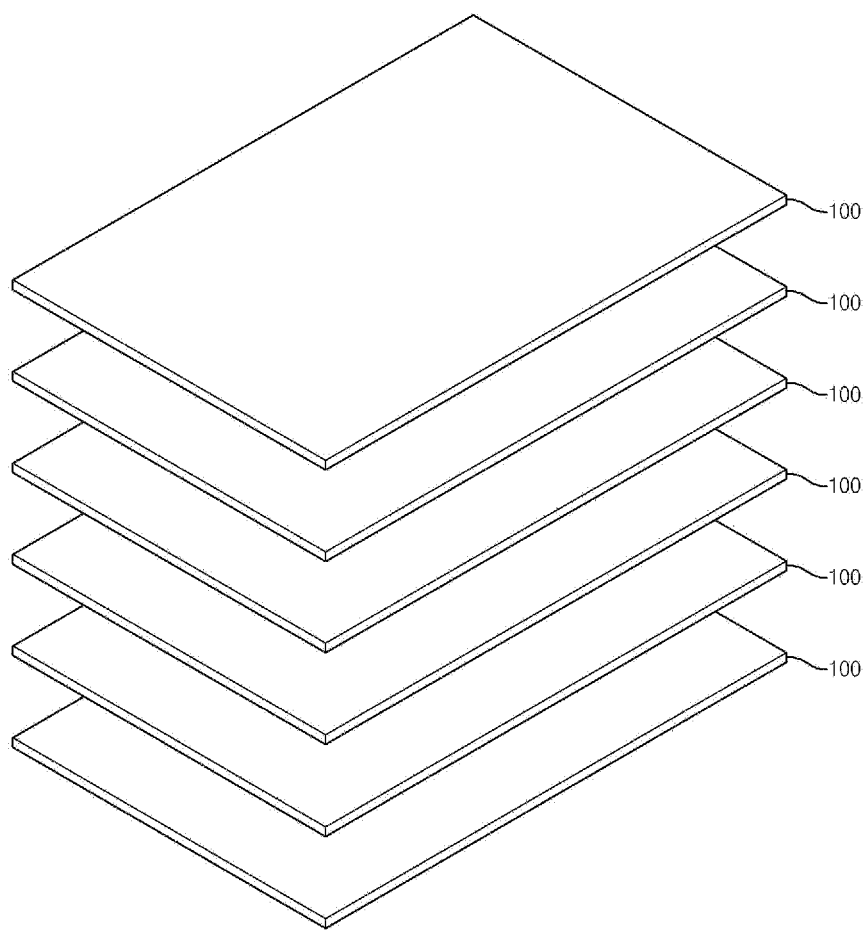
FIGS. 4 to 7 are views illustrating individual steps of the process of manufacturing an optical device substrate according to the present invention.

Upon providing the metal plates 100 (S1), as illustrated in FIG. 4, a plurality of metal plates 100 is provided, and preferably, the metal plates 100 have a rectangular shape and are made of aluminum, an aluminum alloy, magnesium or a magnesium alloy. The other shapes or materials may be adopted, as necessary.

Subsequently, upon anodizing (S2), the metal plates 100 have porous oxide films formed on the surfaces thereof by means of an anodizing process. Because the formed oxide films have a large surface area, a bonding force between the metal plates 100 and the liquid binder 101 which will be subsequently applied thereon may be enhanced, and also insulating properties between the metal plates 100, namely, voltage resistance, may be improved. As such, the anodizing process is typical and a description thereof is thus omitted.

Figure 5:
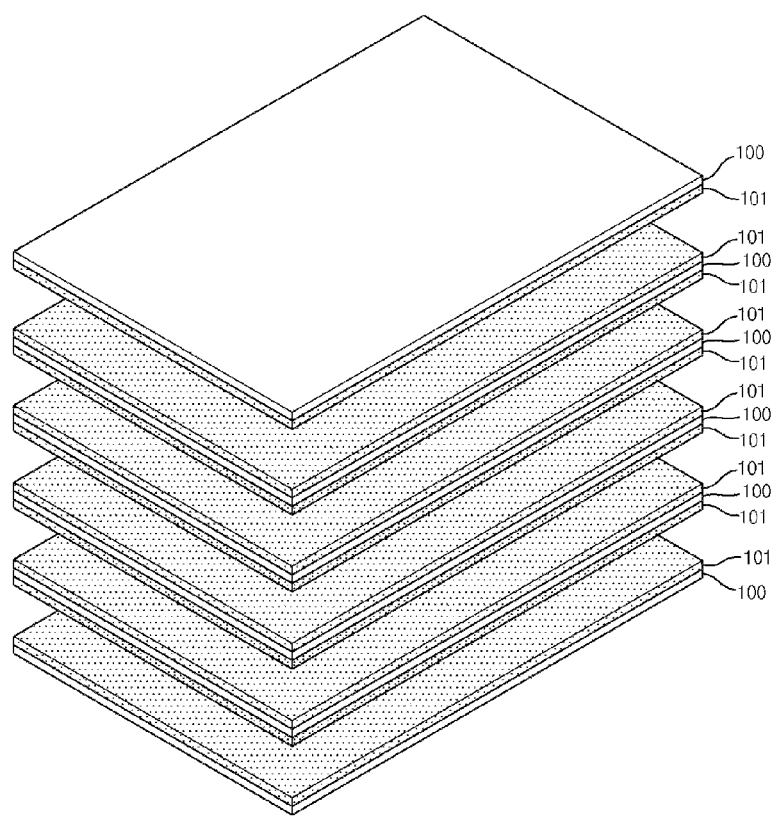

Subsequently, upon applying the liquid binder 101 (S3), as illustrated in FIG. 5, the anodized surfaces of the metal plates 100 are coated with an insulative liquid binder 101.

As such, the liquid binder 101 has a viscosity adapted to infiltrate pores of the oxide films formed on the metal plates 100, so that the liquid binder 101 finely infiltrates the oxide films. Thereby, the bonding area between the liquid binder 101 and the oxide films may be enlarged, thus enhancing the bonding force between the liquid binder 101 and the metal plates 100.

In order to allow the liquid binder 101 to finely infiltrate the oxide films, the viscosity of the liquid binder 101 at room temperature ranging from 5° C. to 40° C. is preferably set to 0.1~1 Pa·s.

Selectively, in order to enable the liquid binder 101 to finely infiltrate the oxide films, the viscosity of the liquid binder 101 is preferably set to 0.01~0.03 Pa·s in the thermal treatment temperature range of 80~100° C. in the course of heating in the subsequent curing step. In this case, the liquid binder 101 may finely infiltrate the oxide films in the thermal treatment temperature range of 80~100° C., and the viscosity thereof is drastically increased while gradually increasing the thermal treatment temperature from 100° C. to 200° C., so that this binder is cured in a state of finely infiltrating the oxide films.

The liquid binder 101 may be made of a polymer- or epoxy-based resin, and a thermosetting resin may be used so as to prevent changes in phase under external conditions after curing.

Figure 6:
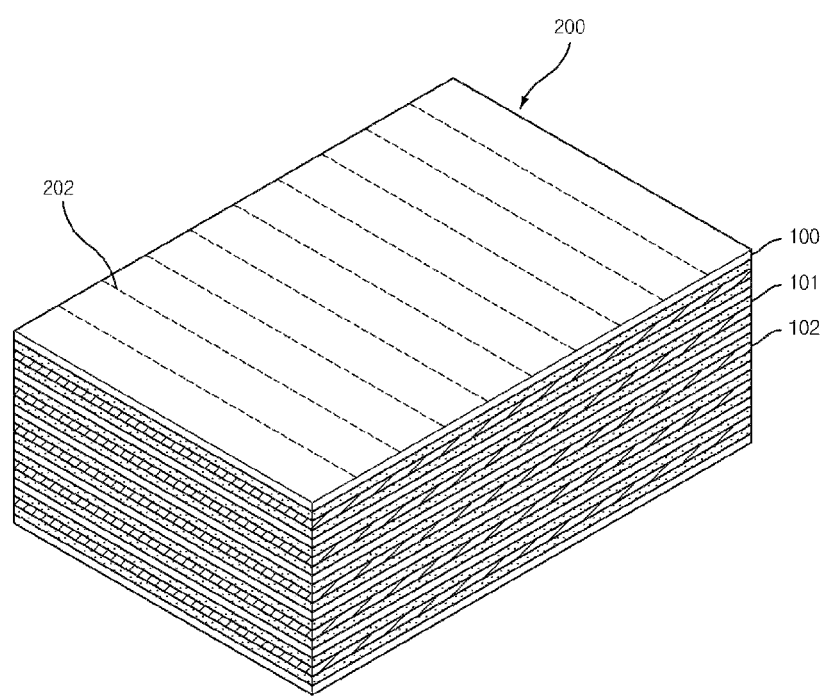

Subsequently, upon stacking the metal plates 100 and the insulative binder films 102 (S4), as illustrated in FIG. 6, before the liquid binder 101 applied on the metal plates 100 is cured, the metal plates 100 coated with the liquid binder 101 and a plurality of insulative resin binder films 102 are alternately stacked to form a laminate. The resin binder films 102 may be formed of a polymer- or epoxy-based resin, and a thermosetting resin may be used so as to prevent changes in phase under external conditions after curing.

In the case where an optical device substrate 300 is manufactured by stacking the metal plates 100 coated with only the insulative liquid binder 101, the liquid binder 100 may bubble upon thermal curing, and thus the insulating layers 303 of the optical device substrate 300 are remarkably decreased in mechanical strength, undesirably making it easy to break the optical device substrate 300. However, in the present invention, when an optical device substrate 300 is manufactured by stacking the metal plates 100 coated with the insulative liquid binder 101 and the insulative resin binder films 102, bubbling of the liquid binder 101 may be suppressed during thermal curing, and thereby mechanical strength of the optical device substrate 300 may be enhanced and fragility of the liquid binder after curing may be decreased.

Also, in the case where an optical device substrate 300 is manufactured by stacking the metal plates 100 coated with only the insulative liquid binder 101, the liquid resin may flow down and thus the thickness of the insulating layers 303 of the optical device substrate 300 may become very non-uniform, and also it is very difficult to manufacture the optical device substrate 300 having the insulating layers 303 at a predetermined thickness or more. However, in the present invention, as an optical device substrate 300 is manufactured by stacking the metal plates 100 coated with the insulative liquid binder 101 and the insulative resin binder films 102, the thickness of the insulating layers 303 of the optical device substrate 300 is made uniform, and may also be precisely controlled.

Subsequently, upon curing (S5), the laminate including the metal plates 100 and the binder films 102 is hot pressed, so that the applied liquid binder 101 and the binder films 102 are cured. As such, when the pressure applied to both ends of the laminate is 2~10 kg/cm², the liquid binder may finely infiltrate the oxide films of the metal plates and also excessive mechanical impact may be prevented from being applied to the binder films.

Figure 7:
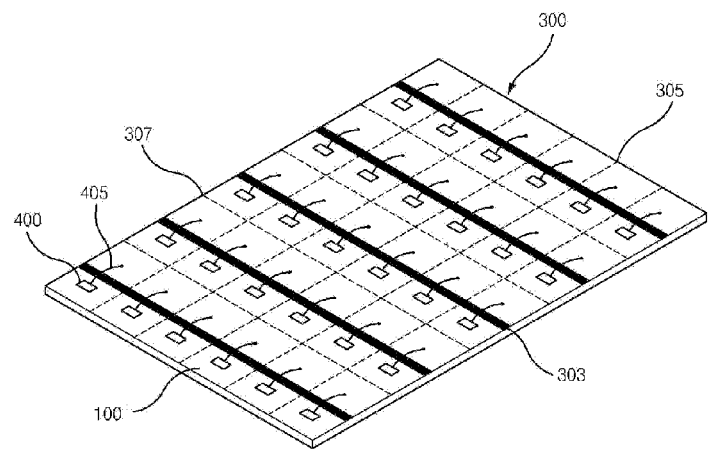

Subsequently, upon cutting the laminate 200 (S6), the cured laminate 200 including the metal plates 100 and the binder films 102 is cut in the same direction as the stacking direction. For example, when the laminate 200 is cut in the same direction as the stacking direction of the laminate 200 based on the cut lines 202 as illustrated in FIG. 6, rectangular optical device substrates 300 may be manufactured, with a predetermined thickness and including the metal layers 100' and the insulating layers 303 which are repeated, as illustrated in FIG. 7.

Figure 8:
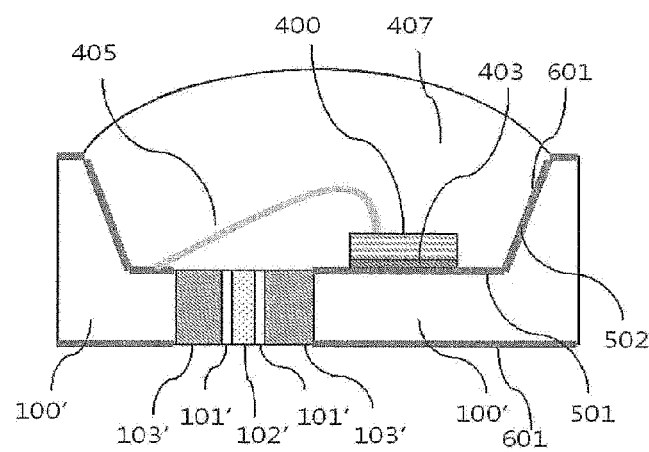
FIGS. 8 and 9 are views illustrating an LED packaged on the optical device substrate according to the present invention.

Thereafter, forming the reflector cup (S7) may be further performed. As illustrated in FIG. 8, the cut surface of the optical device substrate 300 is processed using a cutting tool, thus forming a reflector cup having a bottom surface 501 and an inclined surface 502 extending therefrom. Such a reflector cup is effective at emitting light forward from the optical device 400.

Before or after forming the reflector cup (S7), forming a plating layer 601 on the optical device substrate 300 may be implemented. The plating layer 601 functions to increase reflectivity of light generated from the optical device 400 to thus increase light efficiency, and also to improve welding properties of a conductive wire 405 to the optical device substrate 300 in the subsequent wire-bonding procedure, thus enhancing bondability.

As such, the plating layer 601 may be formed of any one or more selected from among silver (Ag), gold (Au), nickel (Ni), copper (Cu), and palladium (Pd), and the plating layer may be formed using electric plating or electroless plating.

Selectively, the upper surface of the optical device substrate 300 on which an optical device 400 is mounted is plated with Ag having high reflectivity to increase light reflectivity, and the lower surface of the optical device substrate 300 is plated with Ag, Au or Cu having good bondability to solder balls, thus enhancing soldering properties upon mounting the optical device substrate 300 on a printed circuit board (PCB).

Subsequently, as illustrated in FIG. 7, upon bonding the optical device (S8), a plurality of LED devices 400 is bonded at a predetermined interval to the metal layer 100' of the optical device substrate 300. Then, upon wire-bonding (S9), the LED devices 400 each are wire-bonded to the edge of one side of the metal layer 100' facing thereto with the insulating layer 303 being interposed therebetween. Then, upon forming the protective layer 407 (S10), the protective layer 407 is formed on the LED devices 400. Herein, bonding the LED devices 400 to the metal layer 100', wire-bonding the LED devices 400, and forming the protective layer 407 on the LED devices 400 are typical and thus a detailed description thereof is omitted.

Figure 9:
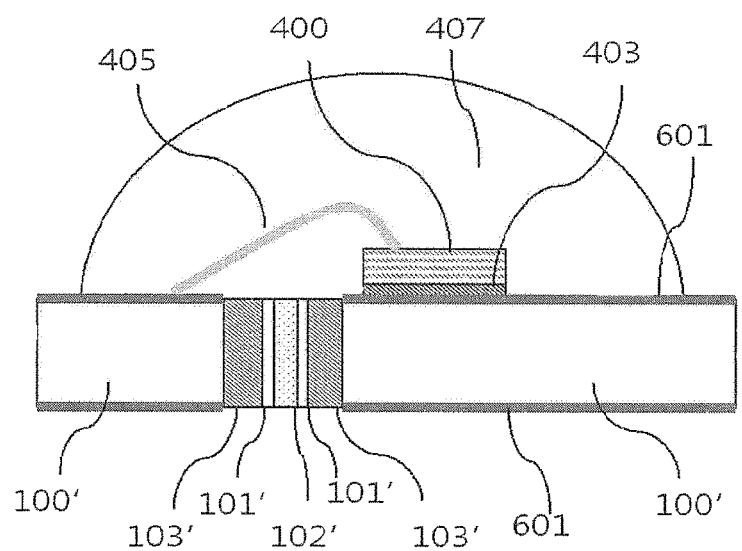

Thereafter, when the packaged optical device substrate 300 is cut in a transverse direction and a longitudinal direction along the cut lines 305, 307 of FIG. 7, as illustrated in FIGS. 8 and 9, each LED device 400 may constitute a single optical device packaging module. Alternatively, when the packaged substrate is cut only in a longitudinal direction along the cut lines 307 of FIG. 7, a plurality of LED devices 400 may constitute a single optical device packaging module.

The packaged optical device substrate 300 is configured as illustrated in FIGS. 8 and 9, wherein the metal electrodes 100' are derived from the metal plate 100, and the insulating layers 101', 102', 103' are respectively derived from the insulative liquid binder 101, the insulative binder film 102, and the oxide film of the metal plate 100. Two metal electrodes 100' are spaced apart from each other by the insulating layers 101', 102', 103', and the optical device 400 is bonded to one metal electrode 100' of the two metal electrodes 100' and wire-bonded to the other metal electrode 100', and is also sealed by the protective layer 407. Therefore, because the optical device is bonded onto the metal electrodes, heat dissipation becomes very effective.

Although the embodiments of the present invention regarding the high heat-radiant optical device substrate and the method of manufacturing the same have been disclosed for illustrative purposes, those skilled in the art will appreciate that a variety of different variations and modifications are possible, without departing from the spirit and scope of the invention. Thus, the above embodiments should be understood not to be limited but to be illustrated.

The scope of the present invention should be determined by the claims which will be described later, and should be understood to incorporate all variations, equivalents and modifications within the spirit and scope of the present invention defined by the claims.

DESCRIPTION OF THE REFERENCE NUMERALS IN THE DRAWINGS

| | |
|---|---|
| 100: metal plate | 101: liquid binder |
| 102: binder film | 200: laminate |
| 300: optical device substrate | 303: insulating layer |
| 202, 305, 307: cut line | 400: optical device, LED |
| 405: conductive wire | 407: protective layer |
| 501: bottom surface | 502: inclined surface |
| 601: plating layer | |
| 100': metal layer, metal electrode | |
| 101', 102', 103': insulating layer | |

The invention claimed is:

1. An optical device substrate comprising metal plates and insulating layers formed between the metal plates,
    wherein each insulating layer includes a cured insulating layer formed by curing insulating material and an anodized layer merged with each metal plate, the anodized layer formed by anodizing a first metal and a second metal of each metal plate,
    the first metal and the second metal include a first anodized layer and a second anodized layer, respectively, and are electrically insulated by interfaces including a first interface formed between the first metal and the first anodized layer, a second interface formed between the first anodized layer and the cured insulating layer, a third interface formed between the cured insulating layer and the second anodized layer and a fourth interface formed between the second anodized layer and the second metal.

* * * * *